United States Patent [19]

Sugawa et al.

[11] Patent Number: 5,263,187
[45] Date of Patent: Nov. 16, 1993

[54] AUTOMATIC GAIN CONTROL CIRCUIT

[75] Inventors: Katsushi Sugawa; Katsuhiro Endo, both of Kanagawa, Japan

[73] Assignee: U.S. Philips Corporation, New York, N.Y.

[21] Appl. No.: 663,955

[22] PCT Filed: Jul. 16, 1990

[86] PCT No.: PCT/JP90/00915

§ 371 Date: May 14, 1991

§ 102(e) Date: May 14, 1991

[87] PCT Pub. No.: WO91/01592

PCT Pub. Date: Feb. 7, 1991

[30] Foreign Application Priority Data

Jul. 15, 1989 [JP] Japan ................. 1-181659
Dec. 8, 1989 [JP] Japan ................. 1-317532

[51] Int. Cl.$^5$ ............... H04B 7/005; H04B 1/16
[52] U.S. Cl. ................ 455/245.1; 455/266; 455/302; 455/340
[58] Field of Search ........... 455/67.1, 245.1, 182.1, 455/192.1, 250.1, 190.1, 266, 214, 296, 295, 302, 306, 307, 339, 323, 311, 312, 340

[56] References Cited

U.S. PATENT DOCUMENTS

| | | | |
|---|---|---|---|
| 3,983,487 | 9/1976 | Ohno | 455/190.1 |
| 4,267,605 | 5/1981 | Matsuzawa et al. | 455/340 |
| 4,918,532 | 4/1990 | O'Connor | 455/207 |
| 5,060,297 | 10/1991 | Ma et al. | 455/302 |
| 5,095,534 | 3/1992 | Hujama | 455/340 |

FOREIGN PATENT DOCUMENTS 55-159618 12/1980 Japan .
56-1608 1/1981 Japan .
57-8231A 5/1982 Japan .

Primary Examiner—Reinhard J. Eisenzopf
Assistant Examiner—Lisa Charouel
Attorney, Agent, or Firm—Leroy Eason

[57] ABSTRACT

Automatic gain control of a communications receiver is provided by including a filter in the upper end thereof having a frequency pass-band which slopes off at each end and can be controllably shifted in a direction and by an amount determined by a control voltage which corresponds to the output signal level. As a result of such shifting of the frequency band relative to the frequency of a received signal, the filter provides adequate gain reduction even for unduly strong received signals and with less signal distortion and lower power consumption than occurs with AGC circuits which operate by changing the bias of a gain control amplifier. If the receiver employs a PLL with a voltage-controlled oscillator, the VCO control signal can be combined with the gain control voltage so as to control the center frequency of the filter pass-band as well as the amount by which it is shifted in order to provide gain control.

9 Claims, 4 Drawing Sheets

AUTOMATIC GAIN CONTROL CIRCUIT

TECHNICAL FIELD

This invention relates to automatic gain control circuits suitable for use in communication apparatus such as wireless receivers, and more particularly to such an automatic gain control circuit which maintains a good gain control characteristic even for unduly large input signals.

The invention also relates to communication apparatus which comprises an automatic gain control circuit of the above-mentioned type.

BACKGROUND ART

A communication apparatus such as a wireless receiver is generally provided with an automatic gain control circuit so that a constant output level can be maintained even when the level of the received signal changes. Particularly when the communication apparatus is a wireless transceiver mounted on a car which is used in circumstances such that the level of a received signal significantly changes, as when passing through tunnels, moving up from a plain to a hill, passing through or between, buildings or approaching the transmitting radio station, the apparatus requires an automatic gain control circuit which can maintain good gain control over a range from a very small received signal level to an unduly large received signal level.

FIG. 10 shows a block diagram of a principal portion of typical wireless receivers which comprise an automatic gain control circuit of the conventional type. This receiver comprises a high-frequency amplifier stage 11 for amplifying a signal received by an antenna 10, a mixer 13 for converting the output of the high-frequency amplifier stage into an intermediate-frequency signal in accordance with a local oscillation signal from a local oscillator 12, an intermediate-frequency amplifier stage 14 for amplifying the intermediate-frequency signal, and a detector stage 15 for demodulating the output of the intermediate-frequency amplifier stage. The detector stage 15 converts the output of the intermediate-frequency amplifier stage 14 into a DC signal to thereby obtain a voltage $V_{AGC}$ for automatic gain control and feeds it back to the respective amplifier stages 11 and 14. In each of the amplifier stages 11 and 14, the bias of an amplifying element thereof is changed in accordance with the voltage $V_{AGC}$ to thereby control its gain. A curve $V_{AGC}$ in FIG. 11 shows one example of the variation of the automatic gain control voltage $V_{AGC}$ in terms of the variation of the received signal level (RSL) in an automatic gain control circuit having the above structure.

In the case where an automatic gain control circuit of the type whose gain is controlled by changing the bias of an amplifying element thereof is employed as described above, the amount of reduction of the gain of one amplifier stage is limited to about 30 dB due to the influence of parasitic capacitance or the like in its amplifier elements, for example, in a wireless receiver. The gain reduction amount is not sufficient particularly in the case of an unduly large received signal level in a communication apparatus of the aforesaid type which is to be mounted on a car. An automatic gain control circuit of this kind also has a deficiency in that the distortion (d) of the output increases with the reduction of gain as indicated by a curve d in FIG. 11.

Furthermore, an automatic gain control circuit of this type brings about an increase of power consumption in its amplifier stage, if the gain control circuit is of the forward AGC type in which the gain is decreased by changing the bias amount in the forward direction, and is therefore not suitable for use particularly in a portable-type communication apparatus. If the gain control circuit is of the reverse AGC type in which the gain is decreased by changing the bias amount in the reverse direction, a power supply of a different polarity is needed to obtain a sufficient reduction of gain, and this brings about an increase of the manufacturing costs.

SUMMARY OF THE INVENTION

It is therefore an object of this invention to provide an automatic gain control circuit which has a broader gain control range as compared to the conventional automatic gain control circuits and is yet able to produce an output having less distortion with regard to an unduly large input signal.

It is another object of the invention to provide an automatic gain control circuit which can control the gain without any substantial increase in power consumption.

It is still another object of the invention to provide an automatic gain control circuit which does not need a plurality of power supplies of different polarities for giving biases to the amplifier stages.

It is a further object of the invention to provide a communication apparatus which comprises an automatic gain control circuit of the above-described type.

For the purpose of achieving the above objects, an automatic gain control circuit according to the invention includes signal level detecting means for detecting the level of a signal at a point in the signal channel and producing a detection signal representative of the signal level. It also includes filter means provided between the input and output terminals of the signal channel and which has a frequency band which is shifted in the direction of higher frequencies or lower frequencies in accordance with the value of the detection signal.

In an automatic gain control circuit of the above construction, the gain in the signal channel is controlled in accordance with the shift of the frequency band of the filter means. It therefore is possible to perform gain control over a broader range without a substantial increase of signal distortion as compared to an automatic gain control circuit of the conventional type in which the gain is controlled by changing the bias of an amplifier within the signal channel. The filter means may be constituted by a filter circuit which includes an induction element and a variable capacitance element, the capacitance of the variable capacitance element being varied based on the aforesaid detection signal.

According to the invention, a communication apparatus comprising an automatic gain control circuit of the above construction is also provided. With this kind of communication apparatus, when it is constructed, for example, as a wireless transceiver to be mounted on a car, since a sufficient gain reduction can be performed even when an duly large signal is received, it is possible to achieve stable signal reception with less distortion over a wide range of received signal levels.

An automatic gain control circuit according to the invention may be employed in a communication apparatus which comprises a high-frequency amplifier stage for amplifying a received high-frequency signal, a mixer for converting the amplified high-frequency amplifier stage signal into an intermediate-frequency (IF) signal, an intermediate-frequency amplifier stage for amplifying the IF output signal of the mixer, and a detector stage for demodulating the amplified intermediate-frequency signal. The detector stage comprises detecting means for producing a detection signal indicative of the signal level of the amplified intermediate-frequency signal filter means, having a frequency band which is shifted in accordance with the detection signal, may be provided at one of the input and output sides of the high-frequency amplifier stage. If the filter means are constituted by a cascade connection of a plurality of filter circuits each comprising an induction element and a variable capacitance element, the gain control range can further be increased.

If the above communication apparatus is of the lower heterodyne type, wherein image-frequency waves are included in a lower frequency zone, the frequency band of the filter means may preferably be shifted in the higher-frequency direction with an increase of the output signal level of the intermediate-frequency amplifier stage. On another hand, if the communication apparatus is of the upper heterodyne type, wherein image-frequency waves are included in a higher frequency zone, the frequency band of the filter means may preferably be shifted in the lower-frequency direction with an increase of the output signal level of the intermediate-frequency amplifier stage. With this structure, when the level of the receiving signal increases, the frequency band of the filter means is shifted in the direction opposite to that of the frequency zone in which the image-frequency waves exist, so that effects of the image-frequency waves on the gain control can be reduced.

In the case where the center frequency of the frequency band of the filter means is to be controlled to follow a target reception frequency, combining means for combining the detection signal with a signal representative of the target reception frequency may be provided between the detecting means and the filter means so that the frequency band of the filter means is shifted in accordance with the combined output from the combining means. In this case, the combining means may combine both input signals thereto in such a manner that the center frequency of the frequency band is determined by the signal representative of the target reception frequency, and the center frequency is shifted by an amount determined by the detection signal. In the case where the communication apparatus is a lower heterodyne system, the combining means may combine both input signals thereto such that the center frequency is further shifted in the higher-frequency direction as the signal level at the output of the intermediate-frequency amplifier stage increases. On the other hand, if the communication apparatus is an upper heterodyne system, the combining means may combine both input signals that such that the center frequency is further shifted in the lower-frequency direction as the signal level at the output of the intermediate-frequency amplifier stage increases. With this construction, effects of the image-frequency waves on the gain control can be avoided as in the former case.

DESCRIPTION OF THE PREFERRED EMBODIMENTS

Figure 1:
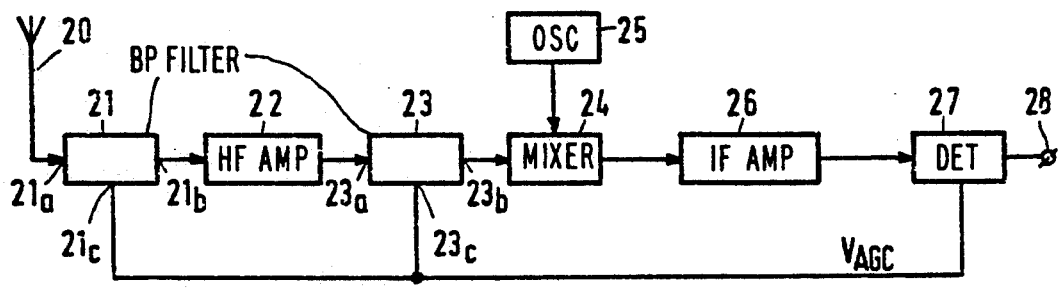
FIG. 1 is a block diagram of a communication apparatus in which an automatic gain control circuit according to a first embodiment of the invention is employed.

FIG. 1 is a block diagram showing the structure of a main portion of a wireless receiver in which an automatic gain control circuit according to a first embodiment of the invention is employed. Therein a high-frequency signal received by an antenna 20 is supplied to a high-frequency amplifier stage 22 via a first band-pass filter 21. The received signal thus amplified by the high-frequency amplifier stage passes through a second band-pass filter 23 and is then supplied to a mixer 24. This mixer is supplied with a local oscillation signal from a local oscillator 25 of the known structure. The mixer 24 produces an intermediate-frequency (IF) signal from an output of the filter 23 in accordance with the local oscillation signal and supplies the IF signal to an intermediate-frequency amplifier stage (or an IF amplifier stage) 26. The amplified IF output signal of the intermediate-frequency amplifier stage 26 is demodulated by a detector stage 27 and is thence supplied at output terminal 28 to an audio amplifier stage or the like which is included in the receiver but are not shown. The center frequency of the frequency band of each of the filters 21 and 23 is brought into agreement with the reception frequency of the receiver by means of a known circuit which is not shown. In this case, the high-frequency amplifier stage 22 and the intermediate-frequency amplifier stage 26 are not necessarily provided with means for controlling gains thereof.

Figure 2:
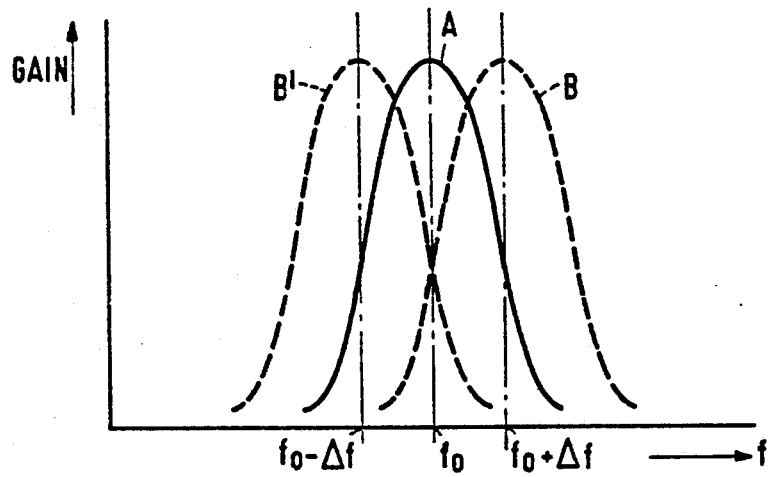
FIG. 2 is a graph showing shifts of the frequency band of the filter 21 or 23 in the communication apparatus shown in FIG. 1.

The detector stage 27 converts the output of the intermediate-frequency amplifier stage 26 into a DC signal to obtain a voltage $V_{AGC}$ for automatic gain control (an AGC voltage), which corresponds to the received signal level, and supplies the voltage $V_{AGC}$, as a voltage for shifting the frequency band, to both filters 21 and 23. As shown in FIG. 2, each of the filters 21 and 23 has a frequency pass-band (solid line A) which slopes off at each end and which can be shifted in the direction of higher frequencies or of lower frequencies (broken line B or B') by a frequency amount (delta f) corresponding to the above gain control voltage $V_{AGC}$. The frequency fo in FIG. 1 indicates the center of the frequency pass-band of each of the filters 21 and 23 at the time when the gain control voltage $V_{AGC}$ is zero, such center frequency fo corresponding to the target reception frequency.

Figure 3:
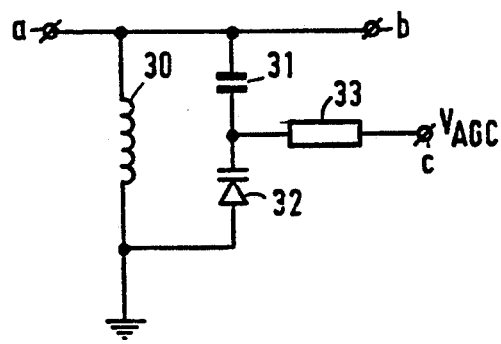
FIG. 3 is a circuit diagram of an example of the filter circuit used in the filter 21 or 23 in the communication apparatus shown in FIG. 1.

FIG. 3 shows one example of an actual filter circuit which may be used in the filters 21 and 23, in which a coil 30 is provided between ground and a connection line between input and output terminals a and b of the relevant filter. In parallel with this coil, there is provided a series connection of a capacitor 31 and a variable capacitance diode 32. A junction point of the capacitor 31 and the variable capacitance diode 32 is coupled to a terminal c by a resistor 33, to which terminal is applied the aforesaid voltage $V_{AGC}$. With the thus constructed band-pass filter, the capacitance of the diode 32 varies in accordance with the voltage $V_{AGC}$, whereby the resonance frequency determined by the inductance of the coil 30 and the capacitance of the capacitor 31 and the diode 32 changes, that is to say, the frequency band is shifted. Each of the filters 21 and 23 may be constituted by a series connection of a plurality of filter circuits, such as that shown in FIG. 3, along the signal path.

Figure 4:
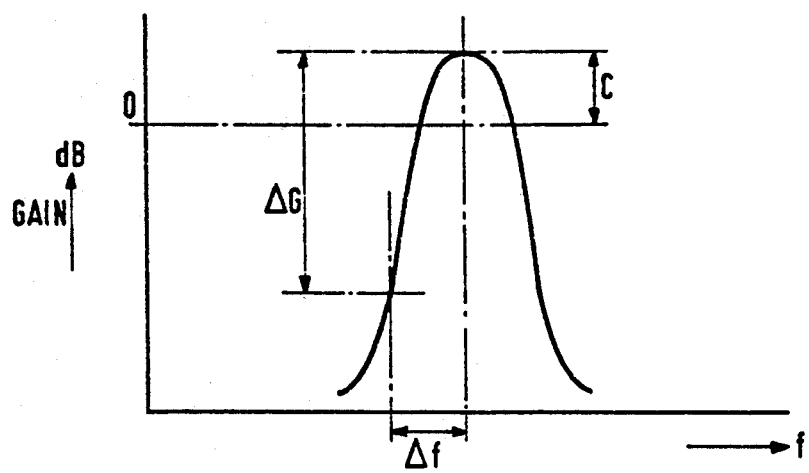
FIG. 4 is a graph showing the variation of gain in that part of the communication apparatus of FIG. 1 which includes the filters 21 and 23 and the high-frequency amplifier stage 22.

Thus, the overall gain of the portion of the receiver comprising the first filter 21, the high-frequency amplifier stage 22 and the second filter 23 is reduced, as shown in FIG. 4, by an amount $\Delta G$ in accordance with the amount $\Delta f$ by which the frequency pass-band of each filter is delta f shifted by the voltage $V_{AGC}$. The drop in gain indicated by the reference character C in FIG. 4 represents a value obtained by subtracting losses in the filters 21 and 23 from the gain of the amplifier stage 22.

In the embodiment of FIG. 1, the overall gain can be reduced by an amount of 60 to 80 dB when the voltage $V_{AGC}$ is changed from 0 volt to 3 volts by suitably selecting the filter characteristic of the filter circuit in each of the band-pass filters 21 and 23 and the number of such filter-circuit stages in each filter.

A wireless receiver which uses a second embodiment of the automatic gain control circuit according to the invention will now be described with reference to FIG. 5, wherein elements corresponding to those in FIG. 1 are denoted by like reference numerals.

The wireless receiver shown in FIG. 5 differs from that shown in FIG. 1 in the following respects. At terminal 40 is supplied a voltage $V_f$ which is accurately brought into correspondence with the receiving frequency of the receiver by means of a phase-locked loop or the like. The voltage $V_f$ is supplied as a frequency control voltage to a local oscillator 41 of the voltage controlled type. The voltage $V_f$ is also supplied to one input terminal 42a of a combining circuit 42. The voltage $V_{AGC}$ supplied by the detector stage 27 is amplified by an amplifier 43 to produce again control voltage $V_C$ which is supplied to the other input terminal 42b of the combining circuit 42.

Figure 6:
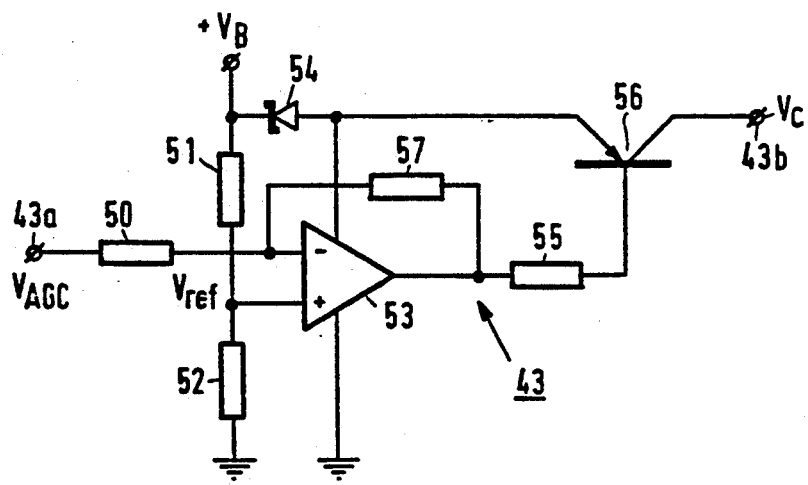
FIG. 6 is a circuit diagram of an example of the amplifier 43 in the communication apparatus shown in FIG. 5.

The amplifier 43 comprises, as shown in FIG. 6, an operational amplifier 53 whose inverting input terminal is supplied through a resistor 50 with the voltage $V_{AGC}$ received at an input terminal 43a, and whose non-inverting input terminal is supplied with a reference voltage $V_{ref}$ derived from a supply voltage $+V_B$ by voltage divider resistors 51 and 52. The amplifier 43 further comprises a pnp transistor 56 having an emitter coupled to the supply voltage $+V_B$ by a Zener diode 54, a base driven by an output of the operational amplifier 53 through a resistor 55, and a collector connected to an output terminal 43b. With an amplifier 43 of this construction, it is possible to convert the voltage $V_{AGC}$ into a voltage $V_C$ which has a value and a variation range suitable for shifting the frequency band of each of the filters 21 and 23, by suitably selecting the voltage $V_{ref}$, the Zener voltage of the Zener diode 54, the resistance value of the resistor 57 interposed between the inverting input terminal and the output terminal of the operational amplifier 53, and so on.

Figure 7:
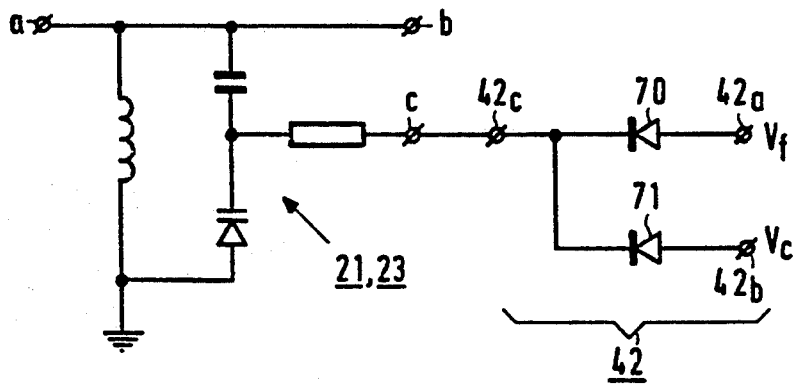
FIG. 7 is a circuit diagram of an example of the combining circuit 42 in the communication apparatus shown in FIG. 5.

The combining circuit 42 combines the voltage $V_f$ with the voltage $V_C$ in the following manner, and supplies the combined voltage to each of the filters 21 and 23 as a band-shifting voltage. More specifically, in the case where the receiver is of a lower heterodyne system wherein the image-frequency waves are produced in a lower frequency zone, the combining circuit 42 comprises, as shown in FIG. 7, a diode 70 for passing the voltage $V_f$ at the terminal 42a in the forward direction thereof to a terminal 42c and another diode 71 for passing the voltage $V_C$ at the terminal 42b in the forward direction thereof to the terminal 42c. With this combining circuit 42, the center frequency of the frequency band of the filter 21 (or 23) set by the voltage $V_f$ is shifted in the direction of higher frequencies, whereby the gain is decreased. In this case, the frequency band is shifted in the direction opposite to the frequency zone in which the image-frequency waves exist, so that effects of the image-frequency waves on gain control can further be reduced. If a more accurate gain control is required, the combining circuit 42 may comprise an adder circuit which adds both inputs at the terminals 42a and 42b together and outputs the addition result to the terminal 42c.

Figure 8:
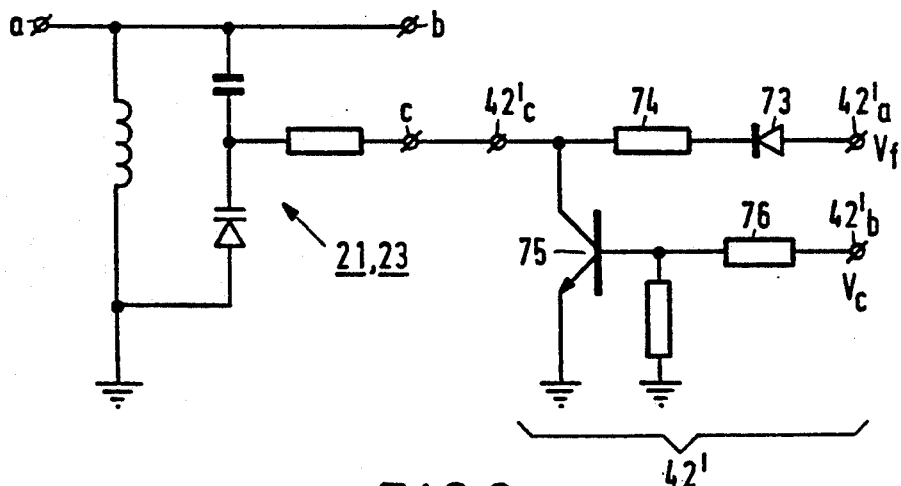
FIG. 8 is a circuit diagram of another example of the combining circuit 42 in the communication apparatus shown in FIG. 5.

In the case where this receiver is of an upper heterodyne system wherein image-frequency waves exist in the higher frequency zone, the combining circuit may be constructed as shown in FIG. 8 at 42'. The combining circuit 42' shown in FIG. 8 comprises a series connection of a diode 73 and a resistor 74 which are interposed between an input terminal 42a', to which the frequency control voltage $V_f$ is supplied, and an output terminal 42c'. An npn transistor 75 is connected between the output terminal 42c' and ground, which transistor has a base to which the gain control voltage $V_C$ at another input terminal 42b' is supplied through a resistor 76. With this combining circuit 42', the center frequency of the frequency band of the filter 21 (or 23) set by the voltage $V_f$ is shifted in the direction of lower frequencies whereby the gain is decreased. In this case, the frequency band is shifted in a direction opposite that of the frequency zone in which the image-frequency waves exist, so that effects of the image-frequency waves on gain control can further be reduced. If more accurate gain control is required, the combining circuit 42' may comprise a subtracter circuit which subtracts the voltage $V_C$ at the terminal 42b' from the voltage $V_f$ at the terminal 42a' and outputs the subtraction result to the terminal 42c'.

Figure 5:
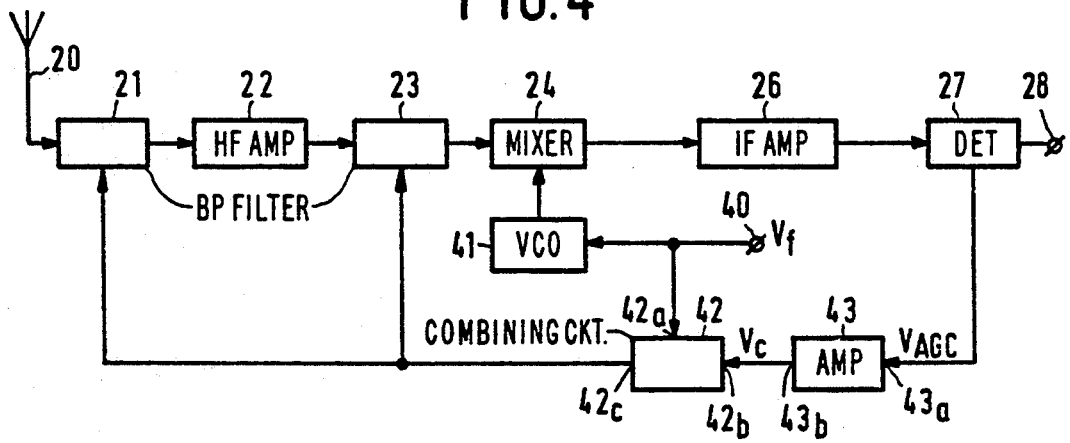
FIG. 5 is a block diagram of a communication apparatus in which an automatic gain control circuit according to a second embodiment of the invention is employed.
Figure 9:
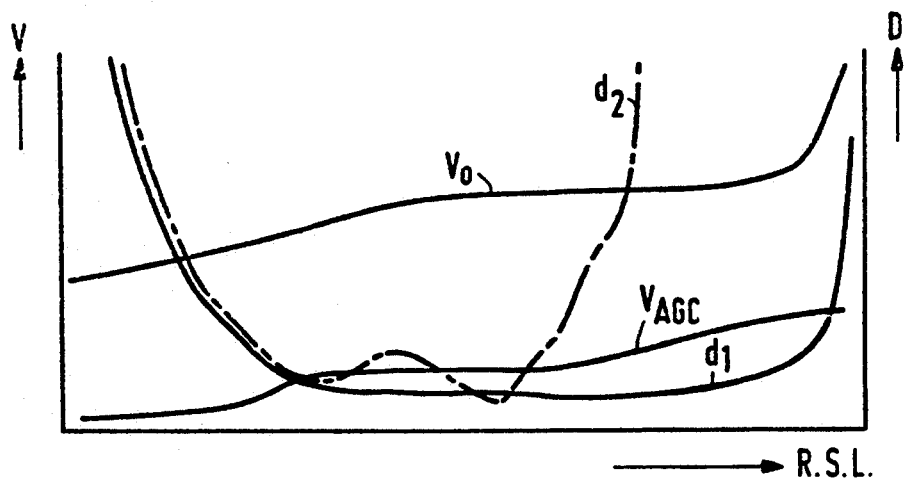
FIG. 9 is a graph showing voltages at various points in the communication apparatus of FIG. 5 and the distortion in the output of the apparatus.
Figure 10:
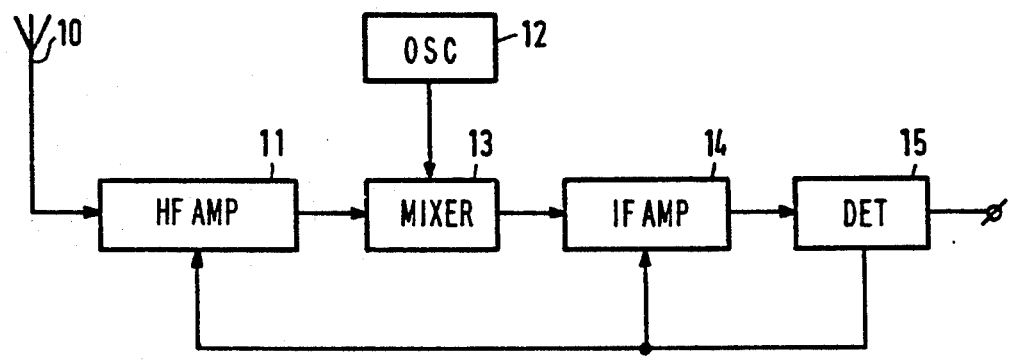
FIG. 10 is a block diagram of a typical wireless receiver in which a conventional automatic gain control circuit is employed.
Figure 11:
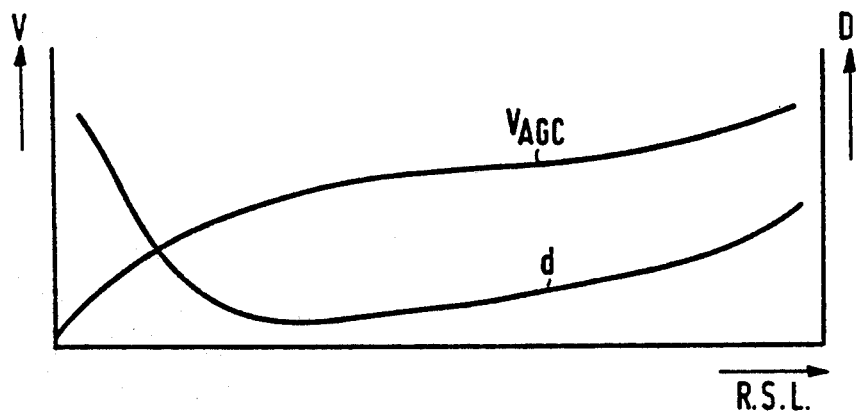
FIG. 11 is a graph showing the characteristic of the conventional automatic gain control circuit shown in FIG. 10.

FIG. 9 shows the gain control characteristic of the automatic gain control circuit in the receiver according to the embodiment of FIG. 5. The curve $V_{AGC}$ indicates the variation of the voltage $V_{AGC}$ in response to variation of the receiving signal level, the curve $V_O$ indicates the output signal level of the receiver, and the curve $d_1$ indicates the distortion of the output signal of the receiver, for comparison, the curve $d_2$ indicates the output signal distortion in a receiver provided with a conventional automatic gain control circuit.

An automatic gain control circuit according to the present invention is suitable for use in a communication apparatus such as an AM and an FM wireless receiver. Also, a communication apparatus according to the present invention can advantageously be used particularly under circumstances such as for a wireless transceiver mounted on a car, where the radio-wave field strength may change abruptly and significantly.

What is claimed is:

1. Communication apparatus having an input for receiving a high frequency signal, an output at which an output signal is produced corresponding to the received signal, and a signal processing channel for deriving said output signal from said input signal; the signal processing channel comprising a high-frequency amplifier stage for amplifying the received signal, a mixer for converting the amplified high-frequency signal into an intermediate-frequency signal, an intermediate-frequency amplifier stage for amplifying said intermediate-frequency signal, and detector means for demodulating the amplified intermediate-frequency signal so as to derive a detection signal corresponding to a signal level of said amplified intermediate-frequency signal; characterized in that said apparatus further comprises filter means interposed in said channel between said input and said mixer and having a frequency pass-band which slopes off at each end thereof, said filter means being controllable by said detection signal to shift said frequency pass-band in a direction and by an amount determined by said detection signal without altering the bandwidth of the pass-band.

2. A communication apparatus as claimed in claim 1, wherein said filter means comprises a series connection of a plurality of filter circuits.

3. A communication apparatus according to claim 1 and which is either (i) a lower heterodyne system in which image-frequency waves are included in a lower frequency zone, or (ii) a upper heterodyne system in which image-frequency waves are included in a higher frequency zone; characterized in that:

when said apparatus is the lower heterodyne system the frequency pass-band of said filter means is further shifted in the higher frequency direction as said signal level of said intermediate-frequency amplifier stage increases, and when said apparatus is the upper heterodyne system, the frequency pass-band of said filter means is further shifted in the lower frequency direction as said signal level of said intermediate-frequency amplifier stage increases.

4. A communication apparatus according to claim 3, further comprising combining means included between said detector means and said filter means for deriving a combination of said detection signal with a signal indicative of a reception frequency of said apparatus, an output of said combining means being supplied to said filter means to control shifting of the center frequency of the frequency pass-band thereof; an increase in the output of said combining means causing said center frequency to be further shifted in a higher frequency direction when said apparatus is the lower heterodyne system; and an increase in the output of said combining means causing said center frequency to be shifted in a lower frequency direction when said apparatus is the upper heterodyne system.

5. A communication apparatus as claimed in claim 4, wherein said filter means comprises a series connection of a plurality of filter circuits.

6. A communication apparatus as claimed in claim 3, wherein said filter means comprises a series connection of a plurality of filter circuits.

7. A communication apparatus according to claim 1, further comprising combining means included between said detector means and said filter means for deriving a combination of said detection signal with a signal indicative of a reception frequency of said apparatus, an output of said combining means being supplied to said filter means to control both the center frequency of the frequency pass-band thereof and the shifting of said frequency pass-band.

8. A communication apparatus according to claim 7, wherein the output of said combining means controls said filter means so that the center of the frequency pass-band thereof is determined by said signal indicative of the reception frequency of said apparatus, and said center frequency is shifted from said reception frequency by an amount determined by said detection signal;

9. A communication apparatus as claimed in claim 4, wherein said filter means comprises a series connection of a plurality of filter circuits.

* * * * *